United States Patent [19]

Fitzpatrick et al.

[11] Patent Number: 5,634,115
[45] Date of Patent: May 27, 1997

[54] SYSTEM AND METHOD FOR BEHAVIORAL DESCRIPTION TRANSLATION

[75] Inventors: Daniel Fitzpatrick, Santa Clara; Kenneth S. Kundert, Belmont, both of Calif.

[73] Assignee: Cadence Design Systems, Inc., San Jose, Calif.

[21] Appl. No.: 355,058

[22] Filed: Dec. 13, 1994

Related U.S. Application Data

[63] Continuation-in-part of Ser. No. 137,842, Oct. 15, 1993, abandoned.

[51] Int. Cl.$^6$ .................................................. G06F 17/00
[52] U.S. Cl. ..................... 395/500; 364/488; 364/489; 364/490; 364/491
[58] Field of Search .................................. 364/488, 489, 364/578; 395/500

[56] References Cited

U.S. PATENT DOCUMENTS

| | | | |
|---|---|---|---|
| 5,047,971 | 9/1991 | Horwitz | 364/578 |
| 5,363,320 | 11/1994 | Boyle et al. | 364/578 |
| 5,469,366 | 11/1995 | Yang et al. | 364/488 |

FOREIGN PATENT DOCUMENTS

| | | | |
|---|---|---|---|
| 0490478A | 3/1993 | European Pat. Off. | G06F 15/60 |

OTHER PUBLICATIONS

J. Sams, "Model the Equation, Not the Circuit", Electronic Engineering, vol. 65 No. 802, Oct. 1993, pp. 43–48.

M. Iordache et al., "Generalized Diakoptic Analysis for Large–Scale Electric Circuits", Revue Roumaine Des Sciences Techniques, Serie Electrotechnique et Enertique, vol. 38, No. 3, Jul. 1993–Sep. 1993 pp. 365–384.

M.L. Blostein, "On the Application of Certain Network Concepts to Artibrary Systems", IEEE Proceedings of the International Symposium on Circuit Theory, 1972 Hollywood, U.S. pp. 213–217.

"A Unified Mixed–Mode Digital Analog Simulation Env.", Odryna, P., IEEE 1988, pp. 893–896.

"Development of an Analog Hardware Description Lang.", Kurker, C., IEEE Custom Integ. Circuits Conf. 1990, pp. 5.4.1–5.4.6.

*Primary Examiner*—Kevin J. Teska
*Assistant Examiner*—Andrew S. Roberts
*Attorney, Agent, or Firm*—Philip E. Blair, Esq.

[57] ABSTRACT

A behavioral description translation method is disclosed wherein output and input access functions are identified from behavioral descriptions of the underlying circuit and its components. Structural representations of the behavioral descriptions of the circuits components as identified by the access functions are constructed therefrom from a set of branch primitives provided. From the constructed branches, those S-type branches, i.e., voltage sources and current probes, that are connected in series between the same pair of nodes into one branch where the voltage on the new branch is the sum of the voltages of the old branches are collapsed. Those P-type branches, i.e., the current sources and voltage probes, that are connected in parallel between the same pair of nodes into one branch where the current through the new branch is the sum of the currents of the old branches are collapsed. Then, for every node in the circuit a single relationship that expresses KCL is generated from the collapsed branch relationships. The relationships thus formed are combined to eliminate un-necessary branch relationships to be provided to the circuit simulator. In such a manner, the higher-level behavioral descriptions can be effectively translated into a lower-level specification which describes the circuit to a simulator program.

28 Claims, 8 Drawing Sheets

```
element template vccs p n ps ns = gain
electrical p,n,ps,ns
number gain=0
{
        equations {
                    i(p->n) += gain*(v(ps) - v(ns))
                 }
}
```

```
element template ccvs p n ps ns = gain
    electrical p,n,ps,ns
    number gain=0
    {
            var i Iin, Iout
            equations {
                i(ps->ns) += Iin
                i(p->n)   += Iout
                Iin:  v(ps) =   v(ns)
                Iout: v(p) - v(n) = gain*Iin
            }
    }
```

```
module vccs (p, n, ps, ns)(gain)
node [V,I] p,n,ps,ns;
parameter real gain=0;
{    analog
                I(p,n) <-- gain*V(ps,ns);
} module ccvs (p, n, ps, ns)(gain)
node [V,I] p,n,ps,ns;
parameter real gain=0;
{    analog
                V(p,n) <-- gain*I(ps,ns);
}
```

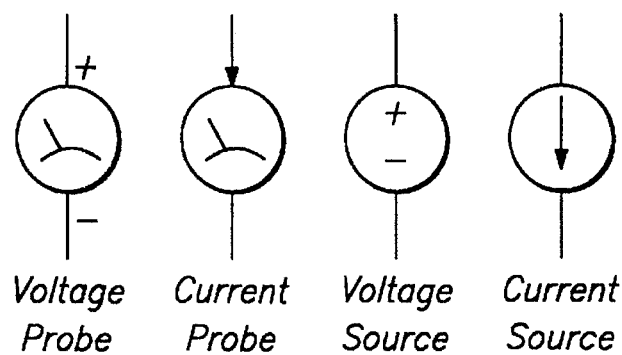
Voltage Probe    Current Probe    Voltage Source    Current Source
FIG. 7
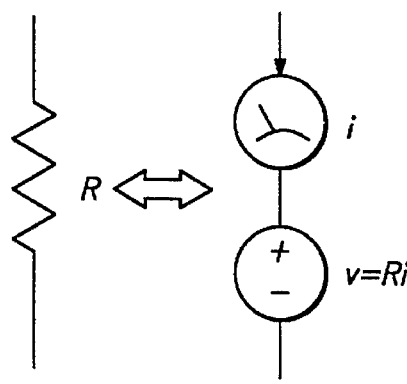 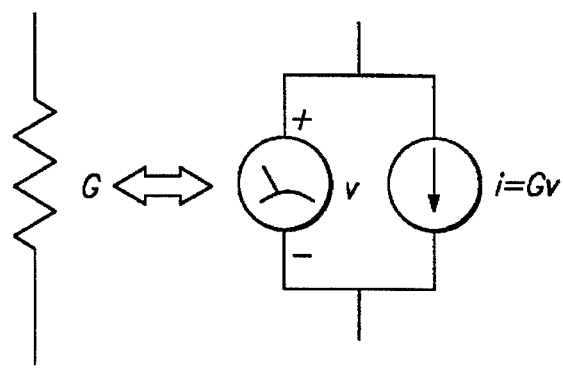
FIG. 8A  FIG. 8B
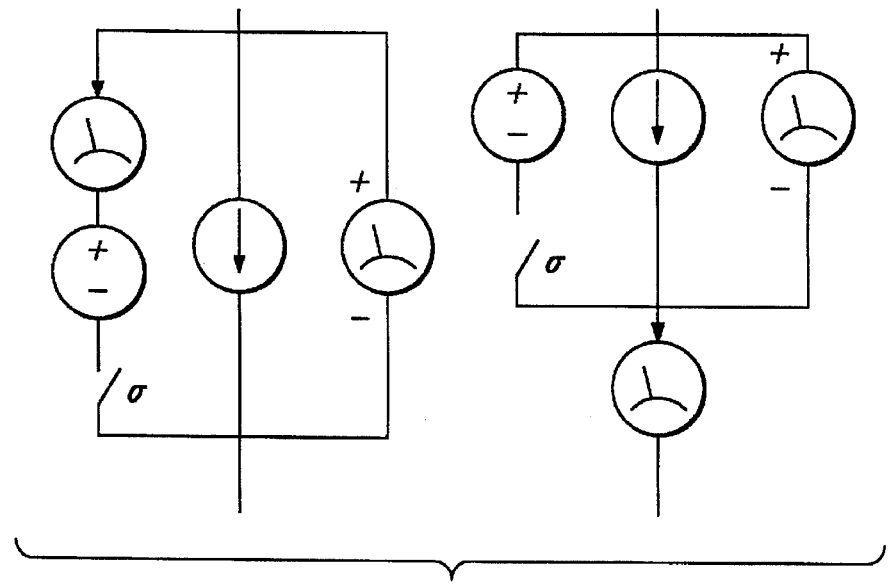
FIG. 9

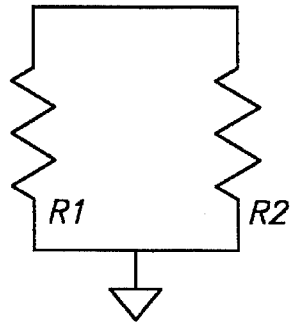

FIG. 10

```
module diode (A, C) (area)
node[V,I]A,C;
parameter real area=1;
{
parameter real is=1e-14;
parameter real n=1;
parameter real cj0=0;
parameter real phi=0.7;
parameter real tau=0;
parameter real rs=0;
parameter real ls=0;
real Vt = 0.259;
real Id;
node[V,I] IntA;

analog {
        // parasitic resistor
(1)     V(A,IntA) <-rs * I(A,IntA) / area;

// parasitic inductor
(2)     V(A,IntA) <-ls * dot(I(A,IntA) ) / area

// junction diode
(3)     Id = area * is * ($exp(V(IntA,C)/Vt) - 1);
(4)     I(IntA,C) <- Id;

// junction capacitor
(5)     I(IntA,C) <- area*dot(tau*Id+
(6)                    2*cj0*$sqrt(phi*(phi-V(IntA,C))));
        }
```

FIG. 11

SYSTEM AND METHOD FOR BEHAVIORAL DESCRIPTION TRANSLATION

RELATED APPLICATIONS

This application is a continuation-in-part of a U.S. patent application entitled ELECTRONIC MODEL GENERATION PROCESS, Ser. No. 08/137,842, filed Oct. 15, 1993 now abandoned.

FIELD OF THE INVENTION

The present invention relates to the field of automated computer-aided design (ECAD) systems for automating and simulating the design of electrical and electronic circuits and, in particular, to those systems and methods which translate higher-level behavioral descriptions into lower-level specifications to describe a circuit and its components to a simulator system.

BACKGROUND OF THE INVENTION

In the art of system design, in order to automate the process of designing and prototyping complex systems, various software and related hardware simulator tools have been developed. A simulator is a program that takes as input a description of a circuit network along with behavioral descriptions for each component contained therein to predict the response of the overall circuit to a given input stimulus. These simulators typically merge systems, components, and input descriptions together. In order to describe the circuit network to the simulator circuit component modeling languages are employed.

To use these modeling languages the circuit designers must understand the internal practices and limitations of the simulator itself because these practices tend to shape the modeling language employed to a relatively large degree. For example, some simulators force users to learn modified nodal analysis (MNA) formulation methodology because certain simulators use this methodology internally to formulate circuit relationships. Although efficient from the simulator's perspective, it can be difficult for most users to fully understand. Thus, extensive training was often needed before these more advanced modeling languages could be fully utilized.

Some modeling languages employ MNA both internally and at the user level. As the name implies, modified nodal analysis is an extension of the nodal analysis method which allows components to be described using constitutive (or branch) relationships that map voltages into currents and inter-connection (or terminal) relationships. The terminal relationships are derived by an application of Kirchoff's laws to a single branch and are independent of both the behavior of the branch and the topology of the network. Presently, languages implement this MNA in a manner in which some of the component's inter-connection relationships are given explicitly and others are given implicitly. For example, if a component is described with a branch relationship that gives electrical current as a function of voltage, the terminal relationships can be merged into the branch relationships. However, for the 3 other possibilities, e.g., voltage from current, voltage from voltage, or current from current, the user is required to explicitly specify additional relationships to fully describe the component's behavior. Any other combination requires the use of additional concepts that circuit designers may find un-natural and counter-intuitive.

Another problem with these type modeling languages is that they only allow one to formulate a branch relationship to specify current as a function of one or more voltages. In particular, one could not directly specify a branch voltage or measure a branch current. These two limitations also force the user to use rather complicated procedures to describe component behaviors whose outputs are given in terms of voltage and whose inputs are given in terms of currents.

For example, consider one description of a voltage-controlled current source (VCCS), implemented as shown in prior art FIG. 1A wherein only the branch relationships are given. Since the voltage controlled current source is relatively simple, the output current can be written as a function of the input voltage.

In another example, consider the description of a current controlled voltage source (CCVS) implemented as shown in prior art FIG. 1B wherein the statements $I_{in}$: v(ps)=v(ns)

$I_{out}$: v(p)−v(n)=gain*$I_{in}$ are the branch relationships. For current controlled voltage sources, an extra relationship is needed to describe the component's characteristics of the output port and an additional relationship may be needed to describe the characteristics at the input ports. In other words, voltage is used as a controlling variable directly. If current is used an additional relationship is needed to fully describe input and output characteristics. Similarly, current can be used as the output directly. If voltage is used then an additional relationship is needed. Thus, there is an asymmetry in the MNA formulation methodology that circuit designers can find confusing.

Therefore, what is needed in this art is a behavioral description translation method which can translate higher-level behavioral descriptions into a lower-level specification for the simulator and which would generate those other relationships needed by a simulator that were not already present in the original higher-level description.

SUMMARY OF THE INVENTION

The present invention is directed to a behavioral description translation method which translates higher-level behavioral descriptions to a lower-level specification to describe a circuit to a circuit simulator program tool.

Briefly summarized, a novel behavioral description translation method is disclosed which translates higher-level behavioral descriptions to a lower-level specification to describe a circuit to a circuit simulator program tool. The preferred embodiment comprises the step of first identifying access functions from the behavioral descriptions of the underlying circuit and its components. Output access functions are used to specify signals and are found on the left-hand side of contribution statements. Input access functions are used to monitor signals and are found in expressions. The signals produced by the sources would be controlled by the signals measured by the probes in a manner specified by these branch relationships. The preferred embodiment has the next step of constructing structural representations of the behavioral descriptions of the circuits components as identified by the access functions. Four branch primitives are preferred herein to facilitate this construction. The preferred method further comprises the step of collapsing those S-type branches, i.e., voltage sources and current probes, that are connected in series between the same pair of nodes into one branch where the voltage on the new branch is the sum of the voltages of the old branches. Then, collapsing those P-type branches, i.e., the current sources and voltage probes, that are connected in parallel between the same pair of nodes into one branch where the current through the new branch is the sum of the currents of the old branches. The next step of the present method comprises for every node in the network generating a single relationship that expresses KCL. The relationships thus formed are combined to eliminate un-necessary branch relationships. In such a manner, a behavior description translation method is disclosed which translate higher-level behavioral descriptions into a lower-level specification to describe the circuit to a simulator program. In such a manner, the simulator can be provided with the relationships necessary to simulate the circuit and its components. Furthermore, the present invention advantageously enables users to treat voltage and current in a similar manner when formulating the higher-level behavioral descriptions.

BRIEF DESCRIPTION OF THE DRAWINGS

In order to more fully understand the present invention, reference is made to the appended drawings. Understanding that these drawings are not to be considered limitations in the scope of the invention, the presently preferred embodiments and the presently understood best mode of the invention are described with additional detail through use of the accompanying drawings in which:

FIG. 7 is a diagram illustrating the preferred set of four primitive branches as implemented herein for defining structural representations of behavioral descriptions from the identified access functions in accordance with the preferred embodiment of the present translation method;

FIG. 8A is an illustration of a simple conductance form of the resistor structurally represented as a parallel combination of a voltage probe and a current source;

FIG. 8B is an illustration of a resistor structurally represented as a series combination of a current probe and a voltage source;

FIG. 9 is a diagram illustrating two alternate structural representations of a branch that is dynamically bound;

FIG. 10 is a simple circuit illustration wherein R1 is implemented as a conductor and R2 is implemented as a resistor;

FIG. 11 is a coded representation of circuit component behavior given in SpectreHDL language syntax;

DETAILED DESCRIPTION OF THE INVENTION

The present invention is directed to a behavioral description translation method which translates higher-level behavioral descriptions to a lower-level specification to describe a circuit to a circuit simulator program tool.

The present invention was implemented using the SpectreHDL behavioral modeling language on a Cadence Spectre circuit simulator, both commercially available. This modeling language supplies the syntax used by the circuit designer to describe component behavior.

Some properties of nodes, branches, and terminals are: any number of terminals, and therefore any number of components, can be connected to the same node; a component may contain more than one branch; and inside a component more than one branch may connect to the same terminal. There are two qualities, in particular, flow and potential which are associated with each node and with each branch. Flow is the amount or rate of migration of matter, charge, etc. and, in electrical circuits, is either current or the movement of charge. The potential at a point is a measure of pressure or force in the applicable discipline that is a necessary requirement to produce flow. For example, in electrical circuits potential is electromotive force which is also referred to as voltage. For purposes of the description herein potential is referred to as the value of the node or branch.

Figures 1A, 1B, 2:
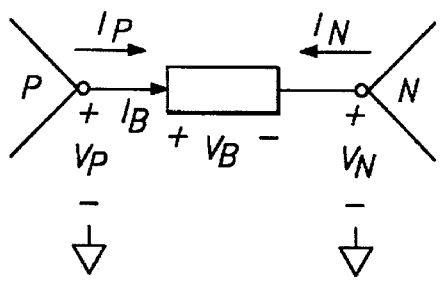
FIG. 1A is a prior art behavioral descriptions of a voltage controlled current source.
FIG. 1B is a prior art behavioral descriptions of a current controlled voltage source.
FIG. 2 is an illustration of directions and signals associated with the illustrated branch and its terminals.

A reference direction is also associated with each branch. The flow through a branch is considered positive if it flows with the reference direction and negative if it flows against the reference direction. Similarly, the potential across the branch is considered positive if flow moving in the reference direction is moving from a higher potential to a lower potential. With a positive potential across the branch, the terminal with the highest potential is considered the positive terminal for the branch, the other is considered the negative terminal. These associated reference directions are illustrated in FIG. 2. For clarity, voltage and current are used herein interchangeably with potential and flow.

At this point it is appropriate to introduce some fundamental concepts associated with potentials and flows referred to as Kirchoff's laws in the electrical/electronic arts. It should be understood that one considered skilled in this art would readily understand the following basic principles and properties pertinent to an understanding of the present invention.

Briefly, Kirchoff's current law describes how the currents combine at the node and Kirchoff's voltage law describes how the voltage is distributed at the nodes. These two laws are the conservation requirements. They describe how the voltage and currents on different branches interact. The conservation relationships are independent of the behavior of the branches but are dependent on the topology of the network and they enforce important requirements such as the conservation of charge or the conservation of mass. In addition, by an application of Tellegen's theorem, they can also be shown to enforce conservation of energy.

As previously discussed, both branch relationships and terminal relationships are needed to fully describe circuit systems and their components to a simulator. The branch relationships are independent of the topology of the network and describe the behavior of the individual branches of the circuit by relating the voltage and current of the branches therein. The terminal relationships are independent of both the behavior of the branch and the topology of the network and are derived by an application of Kirchoff's laws to a single branch. The terminal relationships for current, for instance, describe how current moves between the branch and the nodes. These relationships are: $I_P=I_B$ and $I_N=-I_B$ where $I_B$ is the branch current, $I_P$ is the current flowing out of terminal P, and $I_N$ is the current flowing out of terminal N. The terminal relationship for voltage, for instance, describes how the voltage at the nodes of the branch relates to the voltage on the branch itself. These relationships are: $V_B=V_P-V_N$ where $V_B$ is the branch voltage, $V_P$ is the voltage at terminal P, and $V_N$ is the voltage at terminal N.

Figure 3:
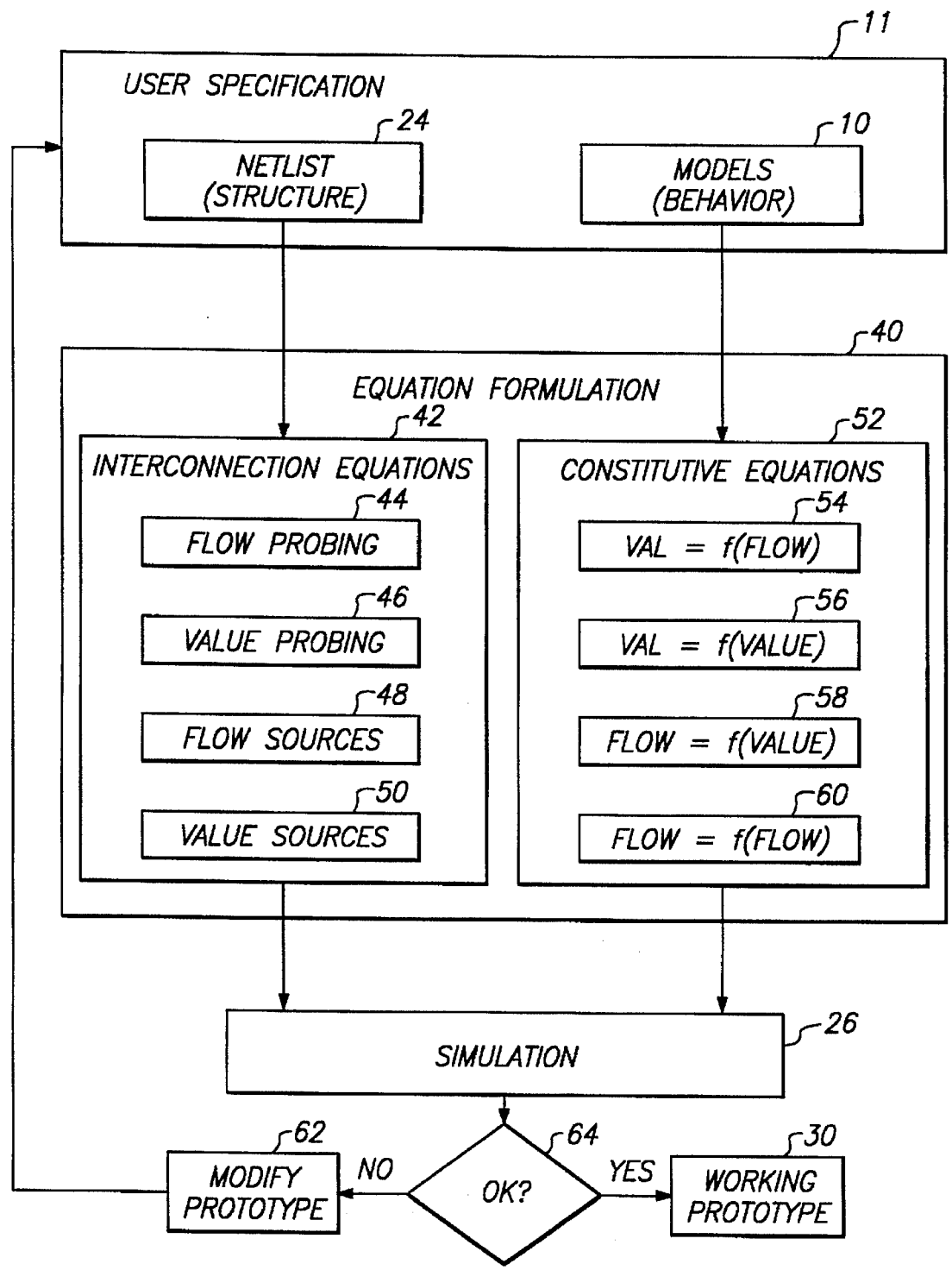
FIG. 3 is a generalized flow diagram of an improved electronic design automation (EDA) process including behavioral description generation according to one embodiment of the present invention.

With respect to a more generalized embodiment of the present invention, attention is respectfully directed to FIG. 3 which is a generalized flow diagram of an improved electronic design automation (EDA) process including behavioral description generation according to one embodiment of the present invention herein described. Initially, user specification 11 of a prototype design is provided, conventionally as an electronic file describing system or circuit structure (netlist) 24 and/or behavior (model) 10. Then, simulation equation formulation 40 is performed automatically largely through software programs and files using conventional computing equipment to modify model 10 according to the present invention described herein.

In particular, upon receiving model 10, a structural representation of model 10 is extracted such that the structural representation is constructed from a set of basic branch types (e.g., value probe, flow probe, value source, or flow source). Based on the structural representation, a set of branch equations 52 (e.g., val=f(flow) 54, val=f(value) 56, flow=f(value) 58, flow=f(flow) 60) are generated in a form compatible with an underlying simulator 26. Additionally, it is determined whether to provide in model 10 an inter-connection equation 42 (e.g., flow probing 44, value probing 46, flow sources 48, or value sources 50) for coupling to a pair of nodes in model 10. After equation formulation 40, conventional simulation 26 is performed on the formulated equations to determine 64 whether the prototype design is acceptable 30 or whether modification 62 is appropriate.

Figure 4:
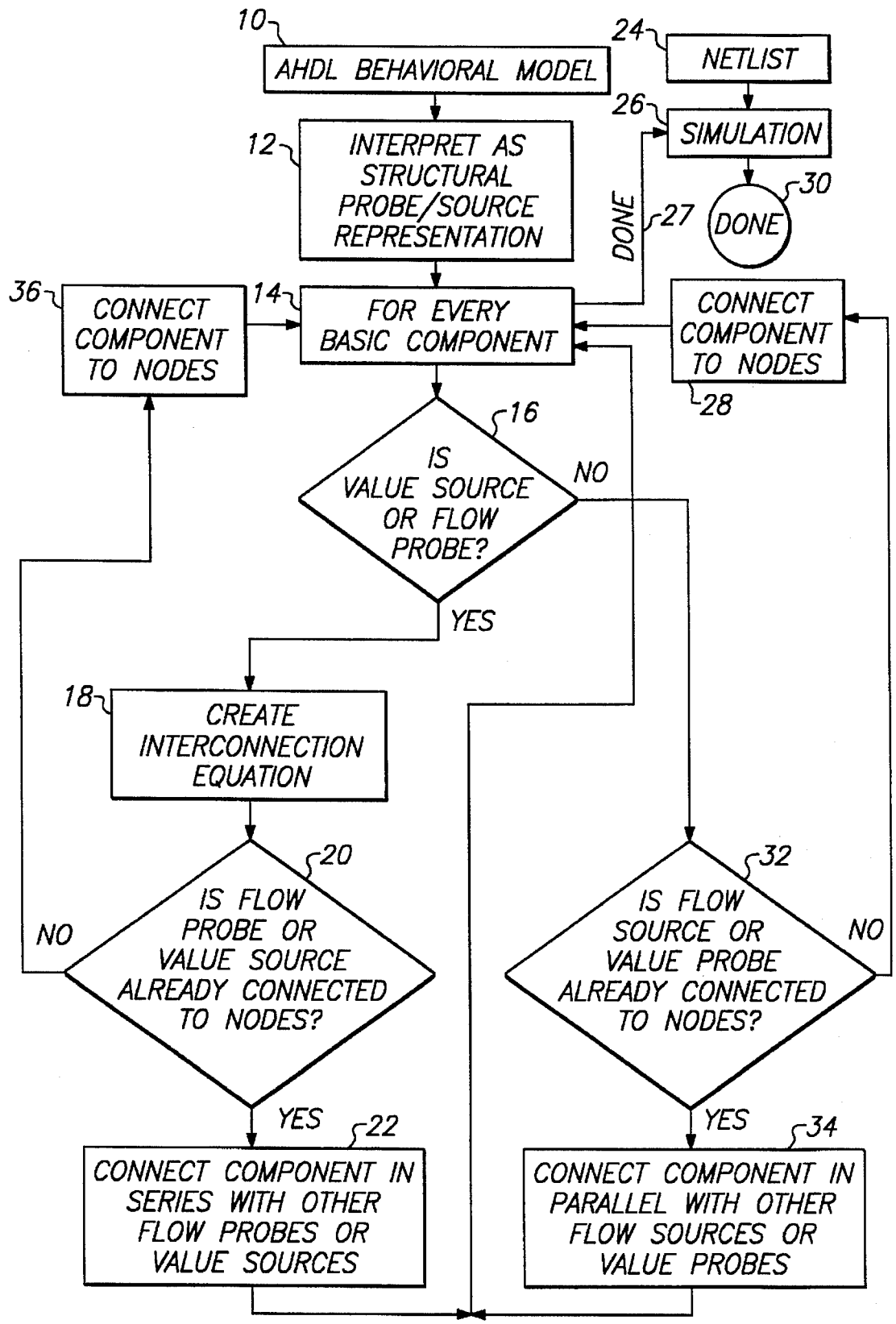
FIG. 4 is a more detailed flow diagram of the more generalized flow diagram of FIG. 3.

Reference is now being made to FIG. 4 which is a more detailed flow diagram of the more generalized flow diagram of FIG. 3. This flow diagram illustrates additional detail in the process of equation formulation 40, which occurs upon receiving behavioral model 10, provided preferably according to an analog hardware description language (AHDL). Initially, model 10, which defines conventional branch elements, is identified or interpreted as pre-defined structural representations. In this way, a structural representation of model 10 is generated or constructed from a set of basic component or branch types, including a value probe, a flow probe, a value source, and a flow source. From such structural representation, a set of branch equations 52 (54–60) is generated or constructed, preferably in a form compatible with an underlying simulator. Moreover, as part of interpreting model 10 for structural representation, it is determined whether to provide automatically in model 10 an interconnect equation 42 for coupling to a pair of nodes included therein.

After model 10 interpretation 12 is performed in equation formulation 40, the generated structural representation is analyzed for every basic component or branch type 14, i.e., until analysis is done 27, at which point netlist 24 and the modified model 10 are simulated 26 and verified 30.

During basic component analysis 14, it is determined 16 for each identified basic component whether such basic component represents a value source (e.g., a voltage source) or a flow probe (e.g., a current probe). If it is determined that the identified basic component represents a value source or a flow probe, then an inter-connection equation 42 is generated 18, preferably corresponding particularly to the basic component or branch type (e.g., flow probing 44, value probing 46, flow sources 48, value sources 50). Then, after inter-connection equation 42 is generated, it is determined 20 whether another flow probe or value source is coupled to another pair of nodes in the structural representation. If it is determined that the other flow probe or value source is not coupled to a pair of nodes in the structural representation, then model 10 is modified 36 to couple the inter-connection equation to that pair of nodes. Alternately, if it is determined that the other flow probe or value source is coupled thereto, then model 10 is modified 22 to couple serially the inter-connection equation to the other flow probe or value source. Also, if it is determined that the identified basic component does not represent a value source or flow probe, then it is determined 32 whether an other flow source 76 or value probe 74 is couple to the pair of nodes 70, 72 of the structural representation, as shown schematically in FIG. 5. If it is determined that the other flow source 76 or value probe 74 is not coupled to pair of nodes 70,72, then model 10 is modified 28 to couple the inter-connection equation to nodes 70, 72. Otherwise, model 10 is modified 34 to couple in parallel the inter-connection equation to the other flow source 76 or value probe 74.

Now that the more generalized embodiment of the present invention has been discussed, the preferred embodiment of the present invention will now be described. Initially, a circuit designer writes a higher-level behavioral description of the underlying circuit and its components using a modeling language. For example, two terminal components are described using SpectreHDL language as follows wherein the symbol "<—" is an assignment operator for the behavioral descriptions in the contribution statements. The following TABLE A outlines four access functions.

| INPUT | OUTPUT |
|---|---|
| voltage ... <-f(V(p,n)) | V(p,n)<- ... |
| current ... <-f(I(p,n)) | I(p,n)<- ... |

TABLE A

Resistors can be expressed with one of the following
contribution statements:
V(p,n) <- R*I(p,n)
I(p,n) <- V(p,n)/R
Capacitors can be expresses in either of the following
two contributions
statements:
I(p,n) <- C*dot(V(p,n))
V(p,n) <- integ(I(p,n))/C
Inductors can be expressed as either of the following
contribution statements:
V(p,n) <- L*dot(I(p,n))
I(p,n) <- integ(V(p,n))/L A series RLC circuit can be formulated by summing the voltages across the three components and is written as the following contribution statement:

$$V(p,n)<-R*I(p,n)+L*dot(I(p,n))+integ(I(p,n))/C$$

A parallel RLC circuit can be formulated by summing the currents through the three components and can be written as the following contribution statement:

$$I(p,n)<-V(p,n)/R+C*dot(V(p,n))+integ(V(p,n))/L$$

Figures 5, 6:
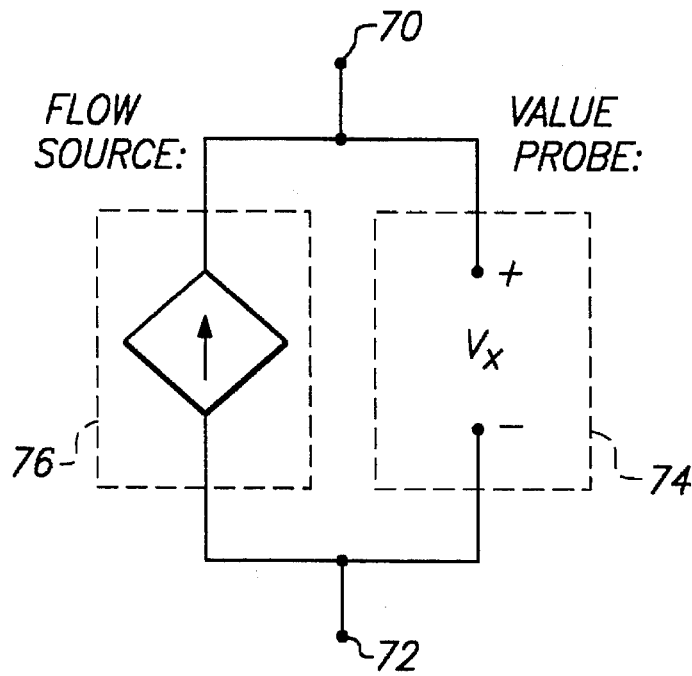
FIG. 5 is a simplified block diagram illustrating flow source 76 and value probe 74 coupled to nodes 70 and 72.
FIG. 6 is a user defined behavioral description of a voltage controlled current source (VCCS) and a current controlled voltage source (CCVS) as defined by the associated contribution statements as written in SpectreHDL syntax.

As an example, attention is respectfully directed to FIG. 6 which is a coded representation of a voltage controlled current source (VCCS) and a current controlled voltage source (CCVS) as written in the above outlined syntax. Notice the application of the syntax to describe the simple example.

The preferred embodiment of the present invention further involves identifying the access functions from the written behavioral descriptions. Output access functions are used to specify signals and are found on the left-hand side of the contribution statement operator. Input access functions are used to monitor signals and are found in expressions on the right hand side of the contribution statement operator. One can think of output access functions as being controlled sources and input access functions as being probes. The signals produced by the sources would be controlled by the signals measured by the probes in a manner specified by the contribution statement.

For example, consider the contribution statement: I(a,b)<—G*V(a,b). The access function V(a,b) is a function that acts as a voltage probe because it is found on the right hand side of the contribution statement operator. The access function I(a,b) is a function that acts as a current source because it is found on the left hand side of the contribution statement operator.

Once the access functions have been identified in the supplied syntax of the behavioral descriptions the next step of the preferred embodiment of the present translation method involves constructing the structural representations of the behavioral descriptions of the circuits components given the identified access functions. A structural representation is constructed using one or more of the illustrated primitive branches, i.e., voltage probes, current probes, voltage sources, and current sources, illustrated in FIG. 7. When constructing the structural representation from the identified primitive branches, there is some freedom as to how these primitives can be combined. Consider the following:

S-Type (serial) branches: Voltage sources and current probes from the same component and attached to the same two nodes are combined in series. Current probes and voltage sources are considered to be S-type because when they are connected to the same nodes within the same component they combine in series.

P-Type (parallel) branches: Current sources and voltage probes from the same component and attached to the same two nodes are combined in parallel. Herein, voltage probes and current sources are considered P-type because when they are connected to the same two nodes within the same component they are combined in parallel.

Mixture of both type branches: When both types are specified between the same two nodes they combine in parallel.

It should be understood that connecting multiple sources between two nodes is equivalent to connecting one source whose output is the sum of their respective contributions. For example the behavioral description defined by the contribution statements: I(p,n)<—x; and I(p,n)<—y; are equivalent to: I(p,n)<—x+y and the statements V(p,n)<—y; and V(p,n)<—x; are therefore equivalent to: V(p,n)<—x+y.

Consider the behavioral description of a simple conductance form of the resistor defined by the contribution statement: I(p,n)<—G*V(p,n). The access functions are V(p,n) and I(p,n) and have the functions as defined above. Once identified, the conductor can then be structurally represented as a parallel combination of a voltage probe and a current source as shown in FIG. 8A. A current source alone has zero conductance but when the current through the source depends on the voltage across the source, the output conductance is non-zero. Further, consider the behavioral description of a resistor defined by the contribution statement: V(p,n)<—R*I(p,n). The access functions are V(p,n) and I(p,n). Once identified, the resistor can be structurally represented as a series combination of a current probe and a voltage source as shown in FIG. 8B. A voltage source alone has a zero resistance but when the voltage across the source depends on the current through the source, as in this case, the output resistance is non-zero.

Reference is now being made to FIG. 9, which is a diagram illustrating two alternate structural representations of a branch 77 and 79 that is considered to be dynamically bound, i.e., it is the special case when a branch is sometimes S-type and sometimes P-type. Circuit designers typically encounter these type branches when modeling ideal switches and ideal diodes which are active or in-active independently. Thus, one, both, or neither can be active at an instant in time. When the P-type (the current source) is in-active it is connected but disabled, i.e., the current is zero. When the S-type (the voltage source) is not active it is disconnected from the circuit completely. The S-type and P-type are separate branches that are implemented independently. The P-type is implemented as a conventional P-type branch. The S-type driver is implemented as a S-type branch that has been modified to include the switch. An S-type branch that has been modified to include the switch is a conditional S-type branch having a branch relationship taking the form:

$$\text{SIGMA}(V_B - g(\ldots)) + (1 - \text{SIGMA})I_B = 0,$$

where SIGMA=1 if the S-type driver is active, and 0 otherwise, and g ( . . . ) is a function Upon the identification of the access functions and the construction of the structural representations, the next step of the preferred embodiment of the present invention involves collapsing those S-type branches (voltage sources and current probes) that are connected in series between the same pair of nodes into one branch where the voltage on the new branch is the sum of the voltages of the old branches. This involves: for every old branch j that is being collapsed into the new branch k, the branch relationship for the branch voltage can be written such that: for all j in ALPHA$_K$ the set of branches that were collapsed to form branch k is: $V_{Bj} = f_j(\ldots)$ and, where $f_j(\ldots)$ is a function representing every old branch j. For every branch that remains after collapsing the S-type branches, the branch relationships are written as:

$$\text{SIGMA}(V_{Pk} - V_{Nk}) + (1 - \text{SIGMA})I_B = \text{SUM}[V_{Bj}]$$

for all j in ALPHA$_K$, where SIGMA=1 if any of the S-type drivers is active. It should be understood that the SUM[ ] is used herein to represent the mathematical summation operation for a defined range. The relationships thus formed are combined to eliminate the $V_{Bj}$ for all j in ALPHA$_K$.

In the instance wherein the branch is not a conditional S-type, then SIGMA is always 1 and can be simplified to:

$$V_{Pk} - V_{Nk} = \text{SUM}[V_{Bj}]$$

for all j in ALPHA$_K$.

The preferred embodiment further comprises collapsing those P-type branches (current sources and voltage probes) that are connected in parallel between the same pair of nodes into one branch where the current through the new branch is the sum of the currents of the old branches. More specifically, this involves: for every old branch j that is being collapsed into the new branch k, the branch relationship for the branch current can be written such that: for all j in BETA$_K$, where BETA$_K$ is the set of branches that were collapsed to form branch k, is $I_{Bj}=f_j(\ldots)$ and, for every branch that remains after collapsing the P-type branches, the branch relationships are written as:

$$I_{Bk}=\text{SUM}[I_{Bj}]$$

for all j in BETA$_K$. The relationships thus formed are combined to eliminate the $I_{Bj}$ for all j in BETA$_K$.

The preferred embodiment further comprises generating the set of relationships that describes the entire system for the simulator. This set of relationships is the combination of three sets of relationships: the nodal analysis relationships of KCL; the branch relationships for P-type branches; and the branch relationships for S-type branches. Thus, in addition to the branch relationships, the nodal analysis relationships must also be defined. This involves: for every node, one relationship is written that expresses KCL, such that:

$$0=\text{SUM}[I_{Bj}]-\text{SUM}[I_{Bk}],$$

for all j in GAMMA$_N$ and for all k in LAMBDA$_N$, where GAMMA$_N$ is the set of branches with positive terminals that connect to node N and LAMBDA$_N$ is the set of branches with negative terminals that connect to node N.

As an example, reference is now being made to the schematic diagram of FIG. 10 where resistor $R_1$ is implemented as a resistor, as shown in FIG. 8A, and resistor $R_2$ is implemented as a conductor, as shown in FIG. 8B. The first set of relationships is the nodal analysis relationships which include one relationship for each node that simply states that the sum of the currents exiting the node must be zero. In this example, there is only one node. Ground is ignored because the written relationship would be redundant, thus: $I_{B1}+I_{B2}=0$. Only P-type branches are contained in the conductor R1, thus: $I_{B1}=V_{B1}/R_1+0$. The first term on the right side of the above relationship is the contribution from the current source. The second term is due to the voltage probe. Recall that: $V_{B1}=V_{P1}-V_{N1}$ and that $V_{P1}$, the voltage on the positive terminal, is equal to $V_1$ the voltage on node 1. Thus, the voltage $V_{N1}$ is the voltage on the negative terminal (which is 0) because the negative terminal is grounded. As a result, the above relationship becomes: $R_1I_{B1}=V_1$. The only S-type branches are contained in the resistor $R_2$. Thus, we have $V_{B2}=R_2I_{B2}+0$. The first term on the right side of this relationship is the contribution from the voltage source. The second term is due to the current probe. Therefore, $V_{B2}$ can be eliminated to: $V_1=R_2I_{B2}+0$. These relationships then can be combined into the following set of relationships:

$$I_{B1}+I_{B2}=0 \quad (1)$$

$$V_1-R_1I_{B1}=0 \quad (2)$$

$$R_2I_{B1}-V_1=0 \quad (3)$$

The last step of the preferred method comprises the step of eliminating un-necessary branch relationships. A branch relationship can be eliminated if the branch current can be solved for explicitly. In other words, if the branch relationship can be rewritten as $I_{Bj}=f(\ldots)$, where $f(\ldots)$ does not contain a reference to $I_{Bj}$; and the branch current is not needed either as an output or as a controlling variable for some other component in the system then it can be eliminated.

To illustrate, attention is specifically directed to the previously generated above set of relationships (1), (2) and (3).

For branch relationships, if the branch relationship can be rewritten as $I_{Bj}=f(\ldots)$, where the function $f(\ldots)$ does not contain a reference to $I_{Bj}$ and if the branch current is not needed either as an output or as a controlling variable for some other component in the system then that relationship can be eliminated in advance. For example: consider $I_{B1}=V_1/R_1$. Eliminating the branch relationship and the branch current for the conductor results in the following:

$$(V_1/R_1)+I_{B2}=0 \quad (4)$$

$$(R_2I_{B2})-V_1=0 \quad (5)$$

which are the relationships for the circuit of FIG. 10.

Figure 12:
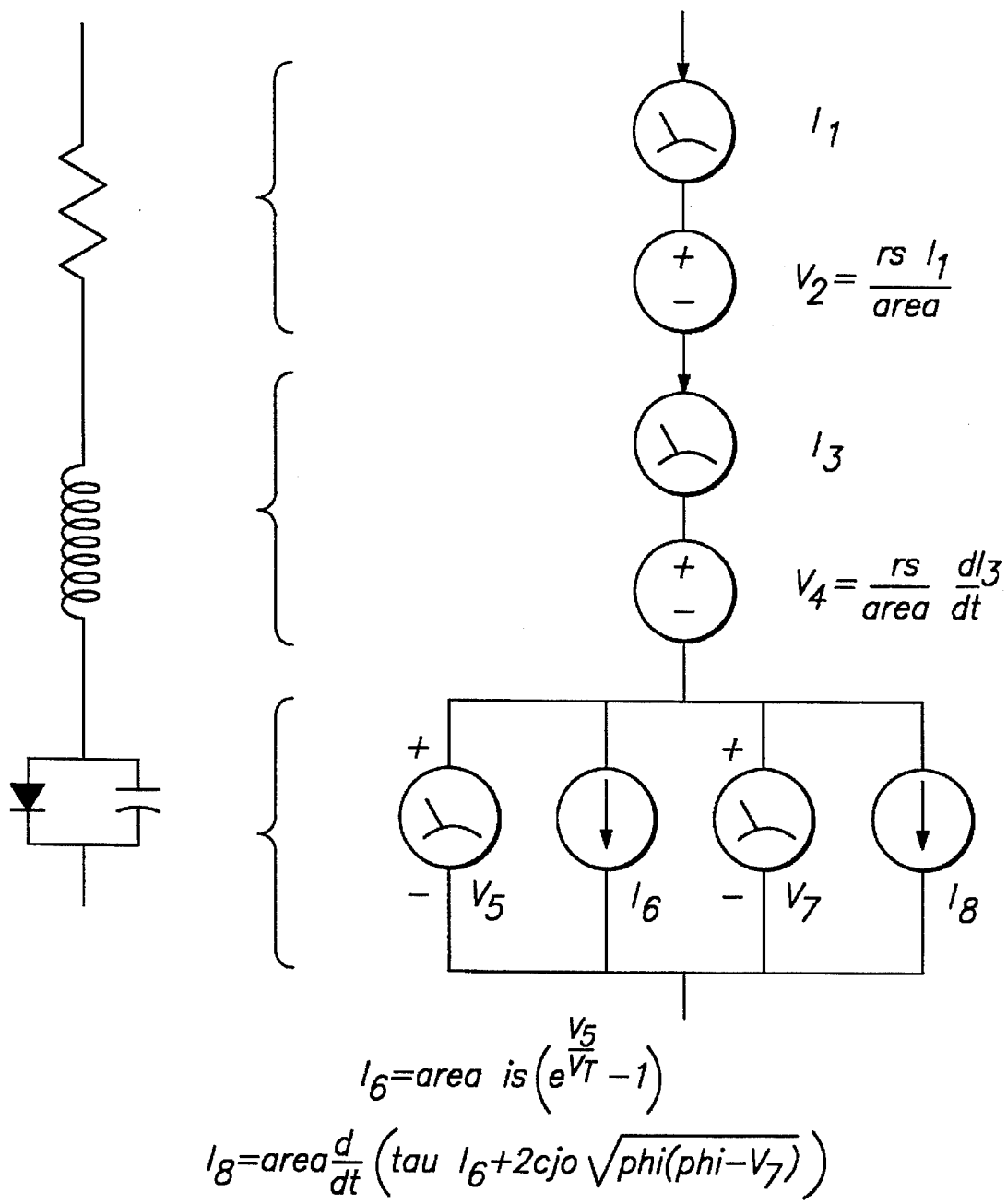
FIG. 12 is a structural representation of the circuit behaviorally described in FIG. 11.

As a further example of an application of the preferred embodiment of the present invention, attention is respectfully directed to FIG. 11 which illustrates a user coded behavioral description of a circuit with series resistance and inductance using SpectreHDL language syntax. In accordance with the preferred embodiment as previously discussed herein, the access functions are first identified in the syntax provided by the circuit designer as a higher-level behavioral description of the underlying circuit. This specific higher-level behavioral description contains a total of 8 access functions. In line (1) of FIG. 11, the access functions are V(A,IntA) and I(A,IntA) for the parasitic resistor. Note the particular side of the contribution statement operator that each access functions is on. In line (2), the access functions are V(A,IntA) and I(A,IntA). In line (3), the identified access function is V(IntA,C). In line (4), I(IntA,C). In line (5), I(IntA,C). And, in line (6), V(IntA,C). Reference is now being made to FIG. 12 which is a structural representation of the circuit higher-level behaviorally described in the syntax of FIG. 11. Both the parasitic resistor and inductor therein each contain a current probe and a voltage source connected between node A and IntA wherein the access function V(A,IntA) on the left side is represented by the voltage source and the access function I(A,IntA) on the right side is represented by the current probe. Since current probes and voltage sources are S-type components they are placed in series between A and IntA. Both the junction diode and capacitor therein each contain a voltage probe and a current source connected between node IntA and C wherein the access function I(IntA,C) on the left side is represented by the current source, and the access function V(IntA,C) on the right side is represented by the voltage probe. Since voltage probes and current sources are P-type components they are placed in parallel between IntA and C.

An application of the next step of the preferred embodiment involves collapsing those S-type branches (voltage sources and current probes) that are connected in series between the same pair of nodes into one branch where the voltage on the new branch is the sum of the voltages of the old branches. In this instance, this involves those which are tied between A and IntA into the following voltage source:

$$V_A-V_{IntA}=(rs*I_{RL}+ls(dI_{RL}/dt))/area$$

An application of the next step of the preferred embodiment involves collapsing those P-type branches (current sources and voltage probes) that are connected in parallel between the same pair of nodes into one branch where the current through the new branch is the sum of the currents of the old branches. In this instance, this involves those which are tied between IntA and C with the following current source:

$$I_j=\text{area } is[e^{(V_j/nVt)}-1+\text{area}(d/dt)(\text{tau } I_d+2cjo*\text{root}(\text{phi}(\text{phi}+V_j)))]$$

The next step of the present method comprises the step of: for every node in the network writing a single relationship that expresses KCL. As such, generating the KCL relationships for the individual components of FIG. 12 produces the following:

$$A: 0=I_{RL}+\ldots \quad (6)$$

$$IntA: 0=I_J-I_{RL} \quad (7)$$

$$C: 0=\ldots -I_J \quad (8)$$

The last step of the present method involves eliminating he unnecessary branch relationships thus formed. Thus, the relationship given by (6) is folded into (7) and (8) thereby eliminating (6) to generate the set of relationships for the circuit of FIG. 12 which will be used by the simulator to describe the circuit and its function. In such a manner, a behavior description translation method is disclosed which translate higher-level behavioral descriptions into a lower-level specification to describe the circuit to a circuit simulator program tool.

Figure 13:
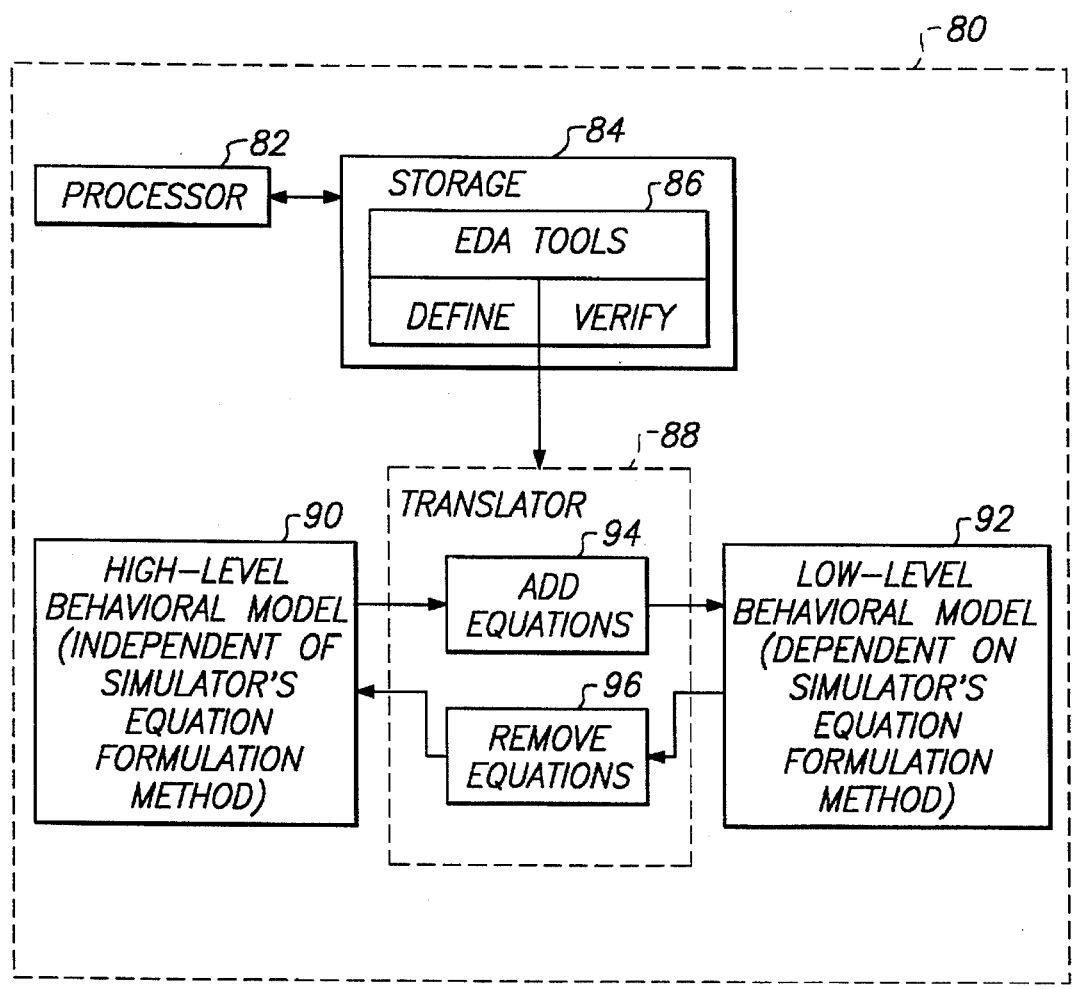
FIG. 13 is a simplified block diagram illustrating an electronic design automation (EDA) system for implementing the behavioral translation method of the present invention.

Reference is now being made to FIG. 13, which is a block diagram of an electronic design automation (EDA) system 80 for implementing the present invention. System 80 includes conventional processor 82 and storage 84, which runs conventional EDA tools 86 for prototype system definition (e.g., netlisting/modeling) and verification (e.g., simulation). As detailed above, the present invention generally resides in providing in conjunction with EDA tools 86 a behavioral-model software translator or modifier 88, for converting a higher-level behavioral model 90, which is independent of the underlying simulator's equation formulation method, to a low-level behavioral model 92, which is dependent on the underlying simulator's equation formulation method, essentially by adding certain inter-connection equations 84 into the model. In an alternative embodiment, low-level behavioral model 92 may be converted to higher-level behavioral model, essentially by identifying and removing such added inter-connection equations.

It should be understood that because the simulator tool is generally a computer program it is envisioned herein that the techniques of the present invention find their implementation in a software algorithm interfaced with the simulator program providing thereto the end relationships generated by the present method.

In summary, a novel behavioral description translation method is disclosed which translates higher-level behavioral descriptions to a lower-level specification to describe a circuit to a circuit simulator program tool. The preferred embodiment comprises the step of first identifying access functions from the behavioral descriptions of the underlying circuit and its components. Output access functions are used to specify signals and are found on the left-hand side of contribution statements. Input access functions are used to monitor signals and are found in expressions. The signals produced by the sources would be controlled by the signals measured by the probes in a manner specified by these branch relationships. The preferred embodiment has the next step of constructing structural representations of the behavioral descriptions of the circuits components as identified by the access functions. Four branch primitives are preferred herein to facilitate this construction. The preferred method further comprises the step of collapsing those S-type branches, i.e., voltage sources and current probes, that are connected in series between the same pair of nodes into one branch where the voltage on the new branch is the sum of the voltages of the old branches. Then, collapsing those P-type branches, i.e., the current sources and voltage probes, that are connected in parallel between the same pair of nodes into one branch where the current through the new branch is the sum of the currents of the old branches. The next step of the present method comprises for every node in the network generating a single relationship that expresses KCL. The relationships thus formed are combined to eliminate un-necessary branch relationships. In such a manner, a behavior description translation method is disclosed which translate higher-level behavioral descriptions into a lower-level specification to describe the circuit to a simulator program.

It will be appreciated by those skilled in this art that the present invention can be embodied in other specific forms without departing form the spirit or essential characteristics thereof. The presently disclosed embodiments are therefore considered in all respects to be illustrative and not restrictive. The scope of the invention is therefore indicated by the appended claims rather than the foregoing description and all changes that come within the meaning and range of equivalents thereof are intended to be considered as being embraced within their scope.

What is claimed is:

1. A method of behavioral description translation of higher-level behavioral descriptions into lower-level specifications to describe a circuit and its components to a simulator system such that users treat voltages and currents symmetrically when formulating the higher-level behavioral descriptions, the method comprising the steps of:

receiving a higher level behavioral description describing voltages and currents symmetrically and identifying access functions contained therein;

constructing at least one structural representation for a component in a circuit from said access functions according to a set of pre-defined primitives such that said at least one structural representation contains a branch internal to said each component that describes behavior of said each component;

generating branch relationships from said constructed structural representations;

eliminating unnecessary branch relationships to produce a reduced relationship set; and providing said reduced relationship set to a simulator system.

2. A method for behavioral description translation of higher-level behavioral descriptions of a circuit to a lower-level specification for a circuit simulator system such that users treat voltages and currents symmetrically when formulating the higher-level behavioral description, the method comprising the steps of:

identifying all access functions in a higher-level behavioral description wherein said higher-level behavioral description describes voltages and currents symmetrically;

constructing a structural representation for each component in a circuit from identified access functions such that said structural representation contains a branch internal to said each component that describes behavior of said each component;

from the structural representations, performing the steps of:

collapsing all S-type branches connected in series between a pair of nodes into one new branch where voltage on the new branch is a sum of voltages of said all S-type branches; and collapsing all P-type branches connected in parallel between another pair of nodes into one second new branch where current through the second new branch is a sum of currents of said all P-type branches;

from said first new and second new branches, generating a set of branch relationships describing said circuit;

combining the generated set of branch relationships to eliminate unnecessary branch relationships therefrom; and providing said reduced relationship set to said circuit simulator system.

3. A method as defined in claim 2 wherein said access functions are selected from a set of voltage and current functions identified in a contribution statement in said higher-level behavioral description.

4. A method as defined in claim 3 where output access functions are used to specify signals and are found on the left-hand side of the contribution statement and input access functions are used to monitor signals and are found in expressions on the right hand side of the contribution statement such that output access functions are controlled sources and input access functions are probes.

5. A method as defined in claim 4 wherein signals produced by said sources are controlled by signals measured by said probes in a manner specified by the contribution statement.

6. A method as defined in claim 2 wherein said structural representations are constructed using one or more primitive branch types from a set containing voltage probes, current probes, voltage sources, and current sources.

7. A method as defined in claim 2 wherein said structural representations comprise a list of all of components in said circuit coupled with parametric information and terminal information.

8. A method as defined in claim 2 wherein a combination of said structural representations comprise a netlist.

9. A method as defined in claim 6 wherein said sources and said probes are S-type branches (voltage sources and current probes) and combine in series when from the same component and attached to the same two nodes.

10. A method as defined in claim 6 wherein said sources and said probes are P-type branches (current sources and voltage probes) and combine in parallel when from the same component and attached to the same two nodes.

11. A method as defined in claim 2 wherein said generated set of relationships further comprises a combination of three sets of relationships: nodal analysis relationships of KCL; constitutive relationships for P-type branches; and constitutive relationships for S-type branches.

12. A computer circuit simulation system for behavioral description translation of a higher-level behavioral description into a lower-level specification such that users of the computer circuit simulation system can treat voltages and currents symmetrically when formulating the higher-level behavioral description, the computer circuit simulation system comprising:

a computer processor unit;

memory media storage connected to said computer processor; and a computer program in communication with said memory media storage and said computer processor unit performing the operation of:

identifying all access functions in the higher-level behavioral description wherein said higher-level behavioral desorption describes voltages and currents symmetrically;

constructing a structural representation for each component in a circuit from identified access functions such that said structural representation contains a branch internal to said each component that describes behavior of said each component from the structural representations, performing the steps of:

collapsing all S-type branches connected in series between a pair of nodes into one new branch where voltage on the new branch is a sum of voltages of said all S-type branches; and collapsing all P-type branches connected in parallel between another pair of nodes into one second new branch where current through the second new branch is a sum of currents of said all P-type branches;

from said first new and second new branches, generating a set of branch relationships describing said circuit; and combining the generated set of branch relationships to eliminate unnecessary branch relationships therefrom.

13. A computer circuit simulation system as defined in claim 12 wherein said higher-level behavioral descriptions are supplied by a supplied computer program syntax using a modeling language.

14. A computer circuit simulation system as defined in claim 12 wherein said system is implemented using a SpectreHDL behavioral modeling language.

15. A method as defined in claim 5 wherein said higher level behavioral description permits Ohm's Law to be expressed in said contribution statement with an input current probe and equivalently in a second contribution statement with an input voltage probe.

16. A method as defined in claim 15 wherein said each component is chosen from a group consisting of a resistor, a capacitor, an inductors, a conductance, and a transistor.

17. A method as defined in claim 16 wherein said circuit includes an RLC circuit.

18. A method as defined in claim 5 wherein said higher level behavioral description permits Faraday's Law of Inductance to be expressed in said contribution statement with an input current probe and equivalently in a second contribution statement with an input voltage probe.

19. A method as defined in claim 2 wherein on each S-type branch of said all S-type branches, said voltage on said each S-type branch is a function of a voltage in said circuit and a current in said circuit, and wherein at least one of said all S-type branches is a conditional S-type branch such that a sum of voltages on said each S-type branch is a difference between a voltage at a first node of said conditional S-type branch and a voltage at a second node of said conditional S-type branch when an S-type driver is active and is a current through said conditional S-type branch when no S-type drivers are active.

20. A method as defined in claim 2 wherein on each P-type branch of said all P-type branches, said voltage on said each P-type branch is a function of a voltage in said circuit and a current in said circuit, and wherein at least one of said all P-type branches is a conditional P-type branch such that a sum of voltages on said each S-type branch is a difference between a voltage at a first node of said conditional S-type branch and a voltage at a second node of said conditional S-type branch when an S-type driver is active and is a current through said conditional S-type branch when no S-type drivers are active.

21. A computer circuit simulation system as defined in claim 12 wherein said access functions are selected from a set of voltage and current functions identified in a contribution statement in said higher-level behavioral description.

22. A computer circuit simulation system as defined in claim 21 where output access functions are used to specify signals and are found on the left-hand side of the contribution statement and input access functions are used to monitor signals and are found in expressions on the right hand side of the contribution statement such that output access functions are controlled sources and input access functions are probes.

23. A computer circuit simulation system as defined in claim 22 wherein signals produced by said sources are controlled by signals measured by said probes in a manner specified by the contribution statement.

24. A computer circuit simulation system as defined in claim 12 wherein said structural representations are constructed using one or more primitive branch types from a set containing voltage probes, current probes, voltages sources, and current sources.

25. A computer circuit simulation system as defined in claim 12 wherein said structural representations comprise a list of all of components in said circuit coupled with parametric information and terminal information.

26. A computer circuit simulation system as defined in claim 12 wherein a combination of structural representations comprise a netlist.

27. A computer circuit simulation system as defined in claim 24 wherein said sources and said probes are S-type branches (voltage sources and current probes) and combine in series when from the same component and attached to the same component and attached to the same two nodes.

28. A computer circuit simulation system as defined in claim 24 wherein said sources and said probes are P-type branches (current sources and voltage probes) and combine in parallel when from the same component and attached to the same component and attached to the same two nodes.

* * * * *